(12) United States Patent
Johnson

(10) Patent No.: US 6,624,485 B2
(45) Date of Patent: Sep. 23, 2003

(54) THREE-DIMENSIONAL, MASK-PROGRAMMED READ ONLY MEMORY

(75) Inventor: Mark G. Johnson, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 38 days.

(21) Appl. No.: 10/010,643

(22) Filed: Nov. 5, 2001

(65) Prior Publication Data

US 2003/0086284 A1 May 8, 2003

(51) Int. Cl.[7] .............................................. H01L 29/76
(52) U.S. Cl. ...................... 257/390; 257/529; 365/103
(58) Field of Search ................................ 257/390, 529, 257/258, 259, 530; 365/103

(56) References Cited

U.S. PATENT DOCUMENTS

| | | |
|---|---|---|
| 3,414,892 A | 12/1968 | McCormack et al. |
| 3,432,827 A | 3/1969 | Sarno |
| 3,576,549 A | 4/1971 | Hess et al. |
| 3,582,908 A | 6/1971 | Koo |
| 3,634,929 A | 1/1972 | Yoshida et al. |
| 3,671,948 A | 6/1972 | Cassen et al. |
| 3,717,852 A | 2/1973 | Abbas et al. |
| 3,728,695 A | 4/1973 | Frohman-Bentchkowsky et al. |
| 3,787,822 A | 1/1974 | Rioult |
| 3,990,098 A | 11/1976 | Mastrangelo |
| 4,146,902 A | 3/1979 | Tanimoto et al. |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,646,266 A | 2/1987 | Ovshinsky et al. |

(List continued on next page.)

FOREIGN PATENT DOCUMENTS

| | | |
|---|---|---|
| EP | 0 073 486 A2 | 3/1983 |
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 3/1995 |
| EP | 0 800 137 A1 | 10/1997 |
| JP | 60-22352 A | 2/1985 |
| JP | 61222216 A | 10/1986 |
| JP | 63-52463 A | 3/1988 |
| WO | WO 94/26083 | 11/1994 |

OTHER PUBLICATIONS

Akasaka, Yoichi, "Three–Dimensional Integrated Circuit: Technology and Application Prospect, "Microelectronics Journal, vol. 20 No. 1–2, 1989, pp. 105–111.

(List continued on next page.)

*Primary Examiner*—Richard Elms
*Assistant Examiner*—Brad Smith
(74) *Attorney, Agent, or Firm*—Brinks Hofer Gilson & Lione

(57) ABSTRACT

A 3-dimensional read only memory includes vertically stacked layers of memory cells. Each of the memory cells includes a mask programmed insulating layer, a pair of diode components, and a pair of crossing-conductors. The conductors (other than those at the top and the bottom of the array) each connect to both overlying conductors via overlying memory cells and to underlying conductors via underlying memory cells.

10 Claims, 3 Drawing Sheets

U.S. PATENT DOCUMENTS

| | | |
|---|---|---|
| 4,672,577 A | 6/1987 | Hirose et al. |
| 4,677,742 A | 7/1987 | Johnson |
| 4,710,798 A | 12/1987 | Marcantonio |
| 4,811,082 A | 3/1989 | Jacobs et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,384 A | 12/1991 | McCollum et al. |
| 5,089,862 A | 2/1992 | Warner, Jr. et al. |
| 5,160,987 A | 11/1992 | Pricer et al. |
| 5,191,405 A | 3/1993 | Tomita et al. |
| 5,202,754 A | 4/1993 | Bertin et al. |
| 5,266,912 A | 11/1993 | Kledzik |
| 5,283,468 A | 2/1994 | Kondo et al. |
| 5,306,935 A | 4/1994 | Esquivel et al. |
| 5,311,039 A | 5/1994 | Kimura et al. |
| 5,334,880 A | 8/1994 | Abadeer et al. |
| 5,391,518 A | 2/1995 | Bhushan |
| 5,398,200 A | 3/1995 | Mazure et al. |
| 5,422,435 A | 6/1995 | Takiar et al. |
| 5,426,566 A | 6/1995 | Beilstein, Jr. et al. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira et al. |
| 5,455,445 A | 10/1995 | Kurtz et al. |
| 5,463,244 A | 10/1995 | De Araujo et al. |
| 5,468,997 A | 11/1995 | Imai et al. |
| 5,471,090 A | 11/1995 | Deutsch et al. |
| 5,481,133 A | 1/1996 | Hsu |
| 5,495,398 A | 2/1996 | Takiar et al. |
| 5,502,289 A | 3/1996 | Takiar et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,686,341 A | 11/1997 | Roesner |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,835,396 A | 11/1998 | Zhang |
| 5,883,409 A | 3/1999 | Guterman et al. |
| 5,915,167 A | 6/1999 | Leedy |
| 5,969,380 A | 10/1999 | Seyyedy |
| 5,976,953 A | 11/1999 | Zavracky et al. |
| 5,985,693 A | 11/1999 | Leedy |
| 6,034,882 A | 3/2000 | Johnson et al. |
| 6,057,598 A | 5/2000 | Payne et al. |
| 6,072,234 A | 6/2000 | Camien et al. |
| 6,087,722 A | 7/2000 | Lee et al. |
| 6,133,640 A | 10/2000 | Leedy |
| 6,185,122 B1 | 2/2001 | Johnson et al. |
| 6,197,641 B1 | 3/2001 | Hergenrother et al. |
| 6,208,545 B1 | 3/2001 | Leedy |
| 6,281,042 B1 | 8/2001 | Ahn et al. |
| 6,291,858 B1 | 9/2001 | Ma et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,420,215 B1 | 7/2002 | Knall et al. |
| 6,525,953 B1 | 2/2003 | Johnson |
| 2001/0033030 A1 | 10/2001 | Leedy |
| 2001/0054759 A1 | 12/2001 | Nishiura |
| 2002/0024146 A1 | 2/2002 | Furusawa |
| 2002/0027275 A1 | 3/2002 | Fujimoto et al. |
| 2002/0030262 A1 | 3/2002 | Akram |
| 2002/0030263 A1 | 3/2002 | Akram |

OTHER PUBLICATIONS

Akasaka, Yoichi, "*Three–Dimensional IC Trends,* " Proceedings of the IEEE, vol. 74, No. 12, Dec. 1986, pp. 1703–1714.

Bertin, Claude L., "*Evaluation of a Three–Dimensional Memory Cube System,*" IEEE Transactions on Components, Hybrids, and Manufacturing Technology, vol. 16, No. 8, Dec. 1993, 1006–1011.

Camperi–Ginestet, C., "*Vertical Electrical Interconnection of Compound Semiconductor Thin–Film Devices to Underlying Silicon Circuitry,*" IEEE Photonics Technology Letters, vol. 4, No. 9, Sep. 1992, pp. 1003–1006.

Douglas, John H., "*The Route to 3–D Chips,*" High Technology, Sep. 1983, pp. 55–59.

Frohman–Bentchkowsky, Dov, "*A Fully Decoded 2048–Bit Electrically Programmable FAMOS Read–Only Memory,*" IEEE Journal of Solid–State Circuits, vol. SC–6, No. 5, Oct. 1971, pp. 301–306.

Hayashi, Y., "*A New Three Dimensional IC Fabrication Technology, Stacking Thin Film Dual–CMOS Layers,*" IEDM 1991, pp. 657–660.

Hayasky, Fumihiko, "*A Self–Aligned Split–Gate Flash EEPROM Cell with 3–D Pillar Structure*" 1999 Symposium on VLSI Technology Digest of Technical Papers, pp. 87–88.

"3–D Chip–on–Chip Stacking," Industry News, Semiconductor International, Dec. 1991.

Inoue, Y., "*A Three–Dimensional Static RAM,*" IEEE Electron Device Letters, vol. Edl.–7, No. 5, May 1986, pp. 327–329.

Jokerst, N.M., "*Manufacturable Multi–Material Integration Compound Semiconductor,*" SPIE—The International Society for Optical Engineering, vol. 2524, Jul. 11–12, 1995, pp. 152–163.

Kurokawa, Takakazu, "*3–D VLSI Technology in Japan and an Example: A Syndrome Decoder for Double Error Correction,*" Future Generations Computer Systems 4, No. 2, Sep. 1988, pp. 145–155.

Lay, Richard W., "*TRW Develops Wireless Multiboard Wireless Multiboard Interconnect System,*" Electronic Engineering Times, Nov. 5, 1984.

Maliniak, David, "*Memory–Chip Stacks Send Density Skyward,*" Electronic Design 42, No. 17, Aug. 22, 1994, pp. 69–75.

Pein, Howard, et al., "*Performance of the 3–D PENCIL Flash EPROM Cell and Memory Array*," IEEE Transactions on Electron Devices, vol. 42, No. 11, Nov. 1995, pp. 1982–1991.

Reber, M., et al., "*Benefits Vertically Stacked Integrated Circuits for Sequential Logic*," IEEE 1996, pp. 121–124.

Sakamoto, Koji, "*Architecture of Three Dimensional Devices*," Bulletin of The Electrotechnical Laboratory, vol. 51, No. 1, 1987, pp. 16–29.

Sato, Noriaki, et al., "*A New Programmable Cell Utilizing Insulator Breakdown*," IEAM Technical Digest, 1985, pp. 639–642.

Schlaeppi, H.P., "*Microsecond Core Memories Using Multiple Coincidence*," 1960 International Solid–State Circuits Conference, Digest of Technical Papers, Feb. 11, 1960, pp. 54–55.

Schlaeppi, H.P., "*Microsecond Core Memories Using Multiple Coincidence*," IRE Transactions on Electronic Computers, Jun., 1960, pp. 192–198.

Stacked Memory Modules, IBM Technical Disclosure Bulletin, May 1995, pp. 433–434.

Stern, Jon M., "*Design and Evaluation of an Epoxy Three–Dimensional Multichip Module*," IEEE Transactions on Components, Packaging, and Manufacturing Technology—Part B, vol. 19, No. 1, Feb. 1996, pp. 188–194.

Terrill, Rob, "*3D Packaging Technology Overview and Mass Memory Applications*," IEEE 1996, pp. 347–355.

Thakur, Shashidhar, "*An Optimal Layer Assignment Algorithm for Minimizing Crosstalk for Three Layer VHV Channel Routing*," IEEE 1995, pp. 207–210.

Watanabe, H., "*Stacked Capacitor Cells for High–Density Dynamic RAMs*," IEDM 1988, pp. 600–603.

Yamazaki, K., "*Fabrication Technologies For Dual 4–KBIT stacked SRAM*," IEDM 1986, pp. 435–438.

"Multilayered Josephson Junction Logic and Memory Devices," Lomatch, S; Rippert, E.D.; Ketterson, J.B., Proceedings of the SPIE–The International Society for Optical Engineering vol. 2157 p. 332–43.

"Advanced Cell Structures for Dynamic RAMs," Lu, N.C.C.: IEEE Circuits and Devices Magazine, vol. 5 No. 1 p. 27–36 Jan. 1989.

"Architecture of Three Dimensional Devices," Sakamoto, K.: Journal: Bulletin of the Electrotechnical Laboratory vol. 51, No. 1 p. 16–29 1987.

"Wide Application of Low–Cost Associative Processing Seen," Electronic Engineering Times, p 43, Aug. 26, 1996.

"Interconnects & Packaging," Electronic Engineering Times, p. 43, Jun. 24, 1996.

"Closing in on Gigabit DRAMs," Electronic Engineering Times, p035, Nov. 27, 1995.

"Module Pact Pairs Cubic Memory with VisionTek," Semiconductor Industry & Business Survey, v17, n15, pN/A Oct. 23, 1995.

"Layers of BST Materials Push Toward 1 Gbit DRAM," Electronics Times, p 10, Oct. 19, 1995.

"Technologies Will Pursue Higher DRAM Densities," Electronic News (1991), p 12 Dec. 5, 1994.

"Looking for Diverse Storage," Electronic Engineering Times, p 44 Oct. 31, 1994.

"Special Report: Memory Market Startups Cubic Memory: 3D Space Savers," Semiconductor Industry & Business Survey, v16, n13, pN/A Sep. 12, 1994.

"Technique Boosts 3D Memory Density," Electronic Engineering Times p 16 Aug. 29, 1994.

"Memory Packs Poised for 3D Use," Electronic Engineering Times p 82 Dec. 7, 1992.

"MCMs Hit the Road," Electronic Engineering Times p 45, Jun. 15, 1992.

"IEDM Ponders the "Gigachip" Era," Electronic engineering Times , p 33 Jan. 20, 1992.

"Tech Watch: 1–Gbit DRAM in Sight," Electronic World News, p 20 Dec. 16, 1991.

"MCMs Meld into Systems," Electronic Engineering Times p 35 Jul. 22, 1991.

"Systems EEs see Future in 3D," Electronic Engineering Times p 37 Sep. 24, 1990.

"Three–Dimensional Memory Array and Method of Fabrication," U.S. patent application Ser. No. 09/560,626, filed Apr. 28, 2000; inventor: Johan Knall.

"Three–Dimensional Memory Array and Method of Fabrication," U.S. patent application Ser. No. 09/814,727, filed Mar. 21, 2001; inventors: Johan Knall and Mark Johnson.

"Vertically–Stacked, Field Programmable, Nonvolatile Memory and Method of Fabrication," U.S. patent application Ser. No. 09/928,536, filed Aug. 13, 2001; inventor: Mark Johnson.

THREE-DIMENSIONAL, MASK-PROGRAMMED READ ONLY MEMORY

BACKGROUND

This invention relates to low-cost, mask-programmed read only memories.

In a conventional manufacturing process for semiconductor integrated circuits, finished wafer cost is almost completely independent of the number of individual die printed on the wafer. Thus die cost is equal to wafer cost divided by the number of die on the wafer. The larger the number of die printed on the wafer, the lower the cost per die. IC manufacturers therefore have a strong incentive to decrease diesize; it allows them to build more die on a (fixed cost) wafer, thereby lowering the cost per die.

Smaller die are desirable for a second reason: the manufacturing yield (the number of good die divided by the total number of die) goes down as the diesize goes up. A smaller diesize gives both a higher yield and a larger number of die sites on the wafer.

Designers of IC's for cost-sensitive applications are well aware of the benefits of small diesize, and they strive to reduce diesize wherever possible. An emerging trend in low-cost IC memory design is to build several "levels" or "planes" of memory cells vertically stacked above one another in a 3-dimensional array. A memory chip having N planes of memory cells in a 3D array can be built in approximately (1/Nth) of the die area of a conventional memory chip having 1 plane of cells in a 2D array. Examples of this technique include Roesner U.S. Pat. No. 4,442,507, Zhang U.S. Pat. No. 5,835,396, Holmberg U.S. Pat. No. 4,499,557, Ovshinsky U.S. Pat. No. 4,646,266, and Johnson U.S. Pat. No. 6,185,122.

Memories which may be written by the end-user are called "field programmable" memories and offer great flexibility, as compared to memories which are written during the manufacturing process and whose contents are not alterable by the end-user ("mask ROMs"). However, the flexibility afforded by field programmable memories also has a cost. Field programmable memories must include additional circuitry that is not needed in mask ROMs, and these extra circuits consume chip area and increase diesize. Mask ROMs do not need data-in circuits, write circuits, or VPP chargepumps; field programmable memories do. Thus mask ROMs can be made with smaller diesize (hence lower cost) than field programmable memories.

For very low cost applications, mask ROMs are preferred because their diesize is smaller (due to the lack of data-in circuits, VPP pumps, write circuits, etc.) Additionally, 3-dimensional memories are preferred because their diesize is approximately 1/Nth as large as 2-dimensional memories. Therefore what is desired is a 3-dimensional memory that is a mask ROM.

Zhang U.S. Pat. No. 5,835,396 discusses embodiments of 3D mask ROMs. However, the semiconductor structures of the Zhang patent require approximately five masking steps per plane of cells: (1) wordline; (2) wordline contact to substrate; (3) bitline; (4) bitline contact to substrate; (5) memory cell programmation via. A memory chip containing N planes of such cells would thus include 5N masking steps to build the array.

Finished wafer cost rises with the number of masking steps used in fabrication, and it is therefore desirable to reduce the number of masking steps required to fabricate a 3D, mask-programmed memory array.

SUMMARY

The preferred embodiments described below are 3D, mask-programmed memory arrays having multiple layers of wordlines and multiple layers of bitlines arranged to cross the wordlines. Except for wordlines positioned at the top or the bottom of the array, each wordline connects (1) to multiple underlying bitlines via respective underlying memory cells and (2) to multiple overlying bitlines via respective overlying memory cells. Similarly, except for bitlines positioned at the top or the bottom of the array, each bitline connects (1) to multiple underlying wordlines via respective underlying memory cells and (2) to multiple overlying wordlines via respective overlying memory cells. Each memory cell includes a respective portion of a respective mask-programmed insulating layer, and the logical state of each memory cell is determined by the conductivity of the respective insulating layer portion. Each memory cell also includes two respective diode components arranged to prevent addressing ambiguity.

The preceding paragraphs have been provided by way of general introduction, and they are not intended to narrow the scope of the following claims.

DETAILED DESCRIPTION OF THE DRAWINGS

Figure 1:
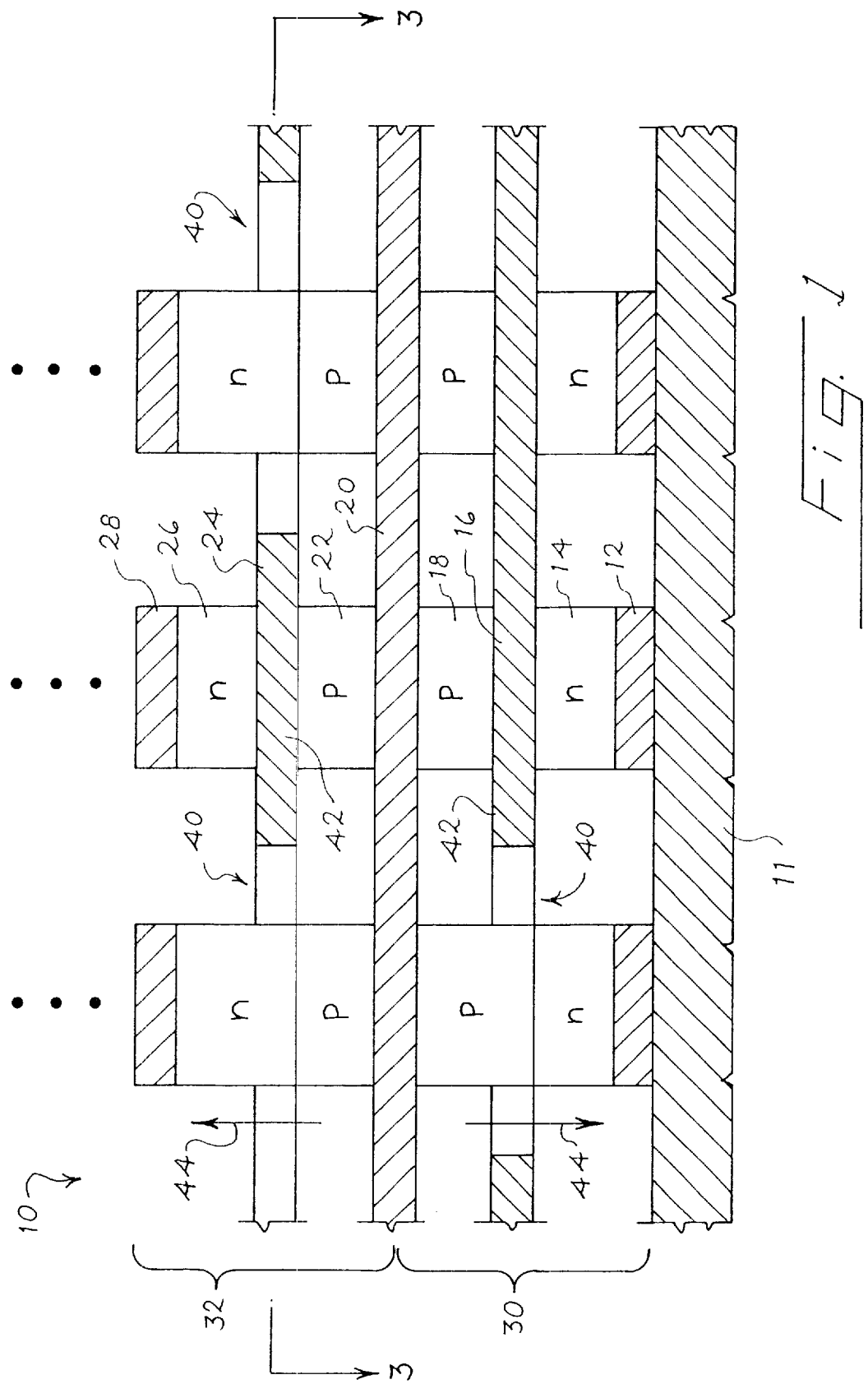
FIG. 1 is a schematic, cross-sectional view of a preferred embodiment of the memory array of this invention.

Turning now to the drawings, FIG. 1 shows a schematic, cross-sectional view of a 3-dimensional, mask-programmed, read only memory array 10. FIG. 1 is schematic in that it shows selected layers of the memory array 10. It should be understood that additional layers can be added as appropriate for a particular application.

The array 10 is a semiconductor structure fabricated on a substrate 11. The array 10 includes a layer of first conductors 12 that in this embodiment are regularly spaced and parallel to one another, extending into and out the plane of FIG. 1. These first conductors 12 may for example correspond to wordlines.

A layer of first diode components 14 overlies the layer of first conductors 12. As explained below, a wide variety of materials can be used for the first diode components, but in this example the first diode components 14 are formed of N-doped polysilicon, e.g., at a dopant concentration of $1 \times 10^{18}/cm^3 – 1 \times 10^{20}/cm^3$.

A first insulating layer 16 overlies the layer of first diode components 14. The insulating layer 16 is a mask-programmed layer, which, as described below, includes conductive portions 40 and insulating portions 42.

Directly overlying the first insulating layer 16 is a layer of second diode components 18. As before, the second diode components 18 can vary widely. In this example, the second diode components 18 are formed of P-type polysilicon, e.g., at a dopant to a concentration of about $1 \times 10^{18}/cm^3 – 1 \times 10^{20}/cm^3$.

A layer of second conductors 20 is formed over the layer of second diode components 18, and the second conductors may function as bitlines. The conductors 20 are, in this example, oriented at right angles to the conductors 12, and the layer of second conductors 20 includes multiple, spaced, parallel conductors 20. Note that the illustrated second conductor 20 crosses over multiple ones of the first conductors 12. As used herein, the terms "intersection" and "crossing" are used broadly to include the situation where the two intersecting or crossing elements are in different planes. Thus, the second conductor 20 is said to intersect or cross the first conductors 12, even though the second conductor 20 never contacts the first conductors 12.

A layer of first diode components 22 is formed immediately overlying the layer of second conductors 20. The first diode components 22 may, for example, be similar in material to the second diode components 18 discussed above.

A second insulating layer 24 is formed immediately overlying the first diode components 22, and as before the second insulating layer 24 includes conductive portions 40 and insulating portions 42. A layer of second diode components 26 overlies the second insulating layer 24. The second diode components may, for example, be similar in material to the first diode components 14 discussed above.

A layer of third conductors 28 overlies the layer of second diode components 26. The third conductors 28 in this example are spaced, parallel conductors oriented parallel to the first conductors 12 and orthogonal to the second conductors 20, and the third conductors 28 may function as wordlines.

The first insulating layer 16 is included in an array of first memory cells 30 that are connected between the first conductors 12 and the second conductors 20. Similarly, the second insulating layer 24 is included in an array of second memory cells 32 that extend between the second conductors 20 and the third conductors 28. Thus, the layers shown in FIG. 1 form two vertically stacked layers of memory cells 30, 32. In a practical embodiment, there often will be additional layers of memory cells (e.g., a total of eight layers of memory cells in one example) that cooperate to form a high-density read only memory.

Figure 2:
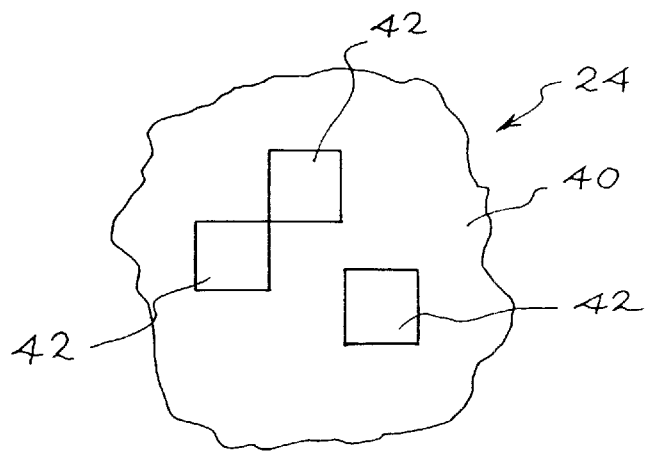
FIG. 2 is a plan view of part of a mask-programmed insulating layer included in the embodiment of FIG. 1.
Figure 3:
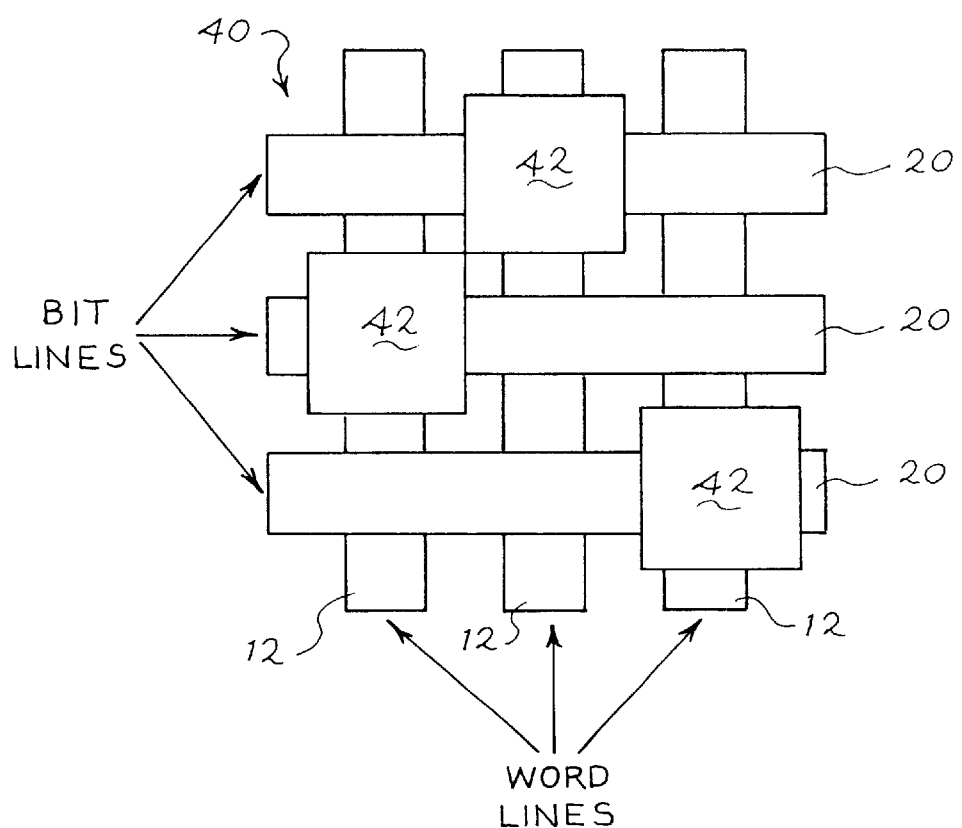
FIG. 3 is a cross sectional view taken along line 3—3 of FIG. 1.

FIG. 2 shows a plan view of a part of the second insulating layer 24. As shown in FIG. 2, the insulating layer 24 includes conducting portions 40 and insulating portions 42. The conducting portions 40 may for example correspond to openings or apertures in the insulating layer 24, and the insulating portions 42 can correspond to regions where the insulating material of the layer 24 remains intact after a conventional masking/etching operation. As shown in FIG. 3, the insulating portions 42 are aligned with selected ones of the memory cells, and the conductive portions 40 are aligned with other ones of the memory cells. Those memory cells that include an insulating portion 42 are characterized by a high resistance between the associated conductors and a first logic state. Those memory cells aligned with conducting portions 40 of the respective insulating layer are characterized by a low resistance (when the associated diode components are forward biased), and therefore a second logic state. As shown in FIG. 1, adjacent diode components can physically contact one another when the conducting portions 40 of the respective insulating layer are formed as openings or apertures in the insulating layer.

The insulating layers 16, 24 can correspond to thin layers of insulating materials. Memory cells to be programmed to a logic 0 can have this insulating material etched away, effectively putting the diode components in series with an electrical short circuit. Memory cells that are programmed to a logic 0 leave the insulating layer intact, effectively putting the diode components in series with an electrical open circuit.

In alternative embodiments, the conducting and insulating portions 40, 42 of the insulating layers may correspond to portions formed from materials that differ in conductivity, thickness or other parameter that alters the effective resistivity of the conducting portions 40 as compared to the insulating portions 42.

It is not essential that each insulating layer be characterized by only two levels of conductivity. In alternative embodiments, regions of three or more differing conductivities can be used to create a memory array having memory cells that each store more than one bit of digital data.

As explained above, the conducting portions 40 have an increased conductivity as compared to the insulating portions 42. In general, the conducting portions 40 may not be perfectly conducting and the insulating portions 42 will not be perfectly insulating. Thus, the terms "conducting portion" and "insulating portion" are intended to signify that the portions differ in electrical conductivity parameters, and it should be understood that the conducting portions 40 will in general be characterized by a non-zero electrical resistance and that the insulating portions 42 will in general be characterized by some degree of electrical conduction.

The memory cells included in the array can be varied widely, as long as they include a mask programmed insulating layer as well as two diode components that provide a preferred conduction direction for the memory cell. In the example of FIG. 1, the first and second diode components 14, 18, and the first and second diode components 22, 26 form diodes, at least in memory cells containing conducting portions 40. In FIG. 1, reference numeral 44 is used to indicate the direction of preferred current conduction. As shown in FIG. 1, all of the first memory cells 30 are oriented with a direction 44 of preferred current conduction oriented oppositely that to the preferred current conduction direction of the memory cells 32.

Figure 4:
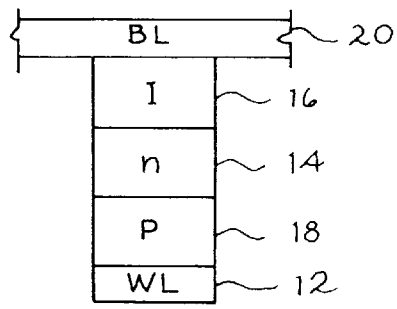
FIGS. 4–9 are schematic representations of alternative memory cell configurations that can be used in the embodiment of FIG. 1.
Figure 5:
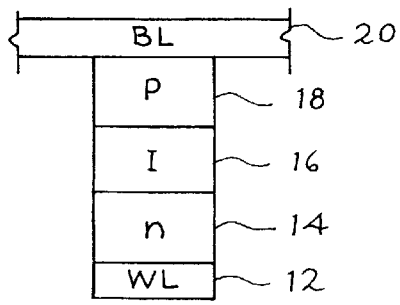
Figure 6:
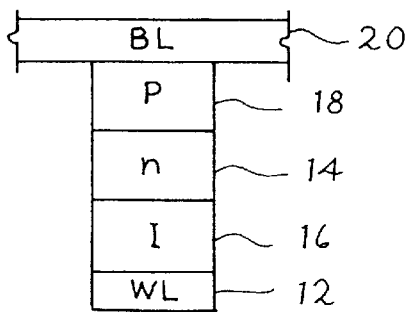

In alternative memory cells, the order of individual layers within a memory cell can be altered, as shown in FIGS. 4, 5 and 6. FIG. 5 represents one of the memory cells 30 described above. FIG. 4 represents an alternative in which the insulating layer 16 is positioned adjacent to the second conductor 20, and FIG. 6 shows an alternative in which the first insulating layer 16 is positioned adjacent the first conductor 12. FIGS. 4, 5 and 6 illustrate one doping arrangement, in which the first diode components 14 are N-type semiconductor and the second diode components 18 are P-type semiconductor. Of course, the reverse plurality is possible, as shown for example in connection with the memory cells 32 of FIG. 1.

Figure 7:
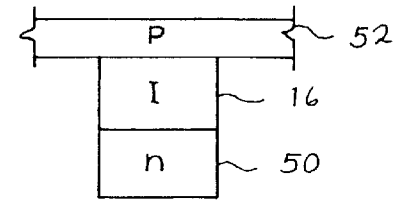
Figure 8:
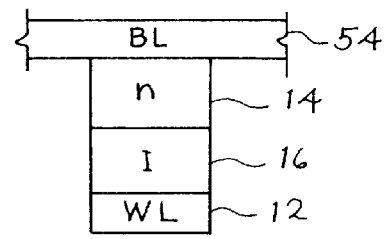
Figure 9:
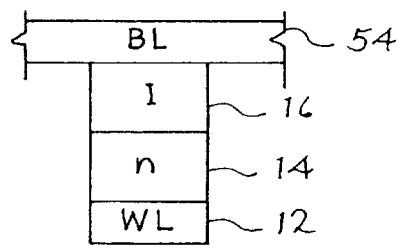

FIGS. 7, 8 and 9 show three additional memory cell constructions. In the memory cell of FIG. 7, the insulating layer 16 is interposed between first and second conductors 50, 52. In this case, the first conductor 50 is a heavily doped N-type semiconductor and the conductor 52 is a heavily doped P-type semiconductor. In this case the conductors 50, 52 include the respective diode components, and no separate layers are required. In general, the memory cells 30, 32 are said to include the intersecting portions of the conductors 12, 20, 28, 50, 52, as well as the intervening layers at the intersection.

The semiconductor structure of FIG. 7 can be fabricated with the following process:

1. Deposit of sheet of N-doped polysilicon;
2. Pattern and etch the N-doped polysilicon into east-west rails including the conductors 50. Fill the etched-out regions between the rails with silicon oxide, and polish the top surface flat, exposing the N-doped polysilicon rails 50.

3. Deposit an insulating layer 16.

4. Using a programming mask, pattern and then etch away the insulating layer over memory cells in the logic zero state and leave the insulating layer 16 intact over memory cells in the logic one state.

5. Deposit a sheet of P-doped polysilicon over the insulating layer.

6. Etch the P-doped polysilicon into north-south, spaced, parallel rails 52. Fill the etched out regions between the rails with silicon oxide and polish the top surface flat, exposing the P-doped rails.

In a practical example, multiple insulating layers would be used as described above. For example, the process described above can be continued with the following steps:

7. Deposit an insulating layer on top of the P-doped rails.

8. Using another programming mask, expose and then etch away the insulating layer over memory cells programmed in the logic zero state and leave it intact over memory cells programmed in the logic one state.

9. Deposit a sheet of N-doped polysilicon over the second insulating layer.

10. Etch the N-doped polysilicon into east-west rails. Fill the etched out regions between the rails with oxide and polish the top surface flat, exposing the N-doped rails.

Steps 3–10 can then be repeated any desired number of times to form additional layers of memory cells.

In this example, the P-doped rails 52 and the N-doped rails 50 have an approximate thickness of 2500 Å and a dopant concentration of $1\times10^{18}/cm^3$–$1\times10^{20}/cm^3$, and the insulating layers 16 have an approximate thickness of 200 Å.

The insulating layers described above vary in thickness, in that they have a thickness in one example of approximately 200 Å where intact, and a thickness of 0 Å where they have been etched away. This thickness variation causes dips in the overlying polysilicon layer. However, these dips can be polished away during the fabrication process.

The memory cell of FIG. 8 relies on a Schottky diode, and the memory cell includes a conductor 54 at one end of the memory cell that is immediately adjacent to a doped semiconductor diode component 14. The conductor 54 is formed of a material such as aluminum suitable for the formation of a Schottky diode, and thus the conductor 54 includes both a conductor for the memory cell and a diode component for the memory cell. As shown in FIG. 9, the insulating layer 16 can be interposed between the conductor 54 and the diode component 14. In this case, the dopant used for the semiconductor diode component of the memory cell is preferably n-type.

Further details regarding alternative memory cell constructions are described in co-pending U.S. patent application Ser. No. 09/928,536, assigned to the Assignee of the present invention and hereby incorporated by reference in its entirety.

The memory arrays described above can be fabricated using many different fabrication techniques. One preferred approach is to use the self-aligning pillar technique described in Johnson U.S. Pat. No. 6,185,122, assigned to the Assignee of the present invention and hereby incorporated by reference. Another approach is to use the rail stack fabrication technique described in U.S. patent application Ser. No. 09/560,626, also assigned to the Assignee of the present invention and also hereby incorporated by reference. These examples should not be taken as limiting, and any suitable fabrication techniques can be used to create the structures described above.

Many materials can be used for the first and second insulating layers, including without limitation the following: silicon dioxide, silicon nitride, ONO, amorphous silicon, tantalum pentoxide, PZT ferroelectric insulators, chalcogenide insulators, organic insulators and polyimide insulators.

As described above, a wide variety of materials can be used to form the first and second diode components, including, without limitation, doped semiconductors and metals. In general, the diode components form a diode, at least when the associated insulating layer is conducting. The type of diode that is formed by the first and second diode components can be varied widely, and can include, without limitation, any of the following: P-N diodes, Schottky diodes, polysilicon diodes, micro-crystalline silicon diodes, micro-crystalline semiconductor diodes, germanium diodes, silicon-germanium diodes and gallium-arsenide diodes.

The conductors 12, 20, 28 can be formed of many materials, including various metals, silicides, and heavily doped semiconductors. A preferred method for forming narrow line-width, titanium disilicide conductors is described in U.S. patent application Ser. No. 09/928,975, assigned to the assignee of the present invention and hereby incorporated by reference.

It should be apparent that the embodiments described above are 3-dimensional, mask programmed, read only memory arrays that can be fabricated at extremely low cost. Circuits such as data-in drivers, VPP pumps, and write circuits are not required for the read only memory, and the elimination of these circuits reduces the diesize of the array. Furthermore, since the memory array includes a 3-dimensional array of memory cells comprising N layers or planes of memory cells, diesize is further reduced approximately by the factor of N. The number of masking steps required to fabricate the array is minimized, because many of the wordlines and bitlines connect both to overlying memory cells and to underlying memory cells.

One advantage of the array 10 as compared with the field programmable arrays of Johnson U.S. Pat. No. 6,185,122, is that the array 10 relaxes the constraints on the thickness of the insulating layers. In the field programmable arrays, this thickness must be tightly controlled in order to keep the programming characteristics of the memory cells within specified limits. This is of course not a requirement for a mask-programmed read only memory, and the main requirement for the insulating layers is that they provide the desired differences in conductivity between the conducting portions and the insulating portions. Thus, the insulating layers can be made thicker and less tightly controlled in the array 10 than in the field programmable memory arrays, which makes manufacturing easier.

As used herein, the terms "overlie" and "underlie" are intended broadly to describe the relative ordering of layers in a stack. A first layer is said to overlie a second layer whether or not there are unnamed intervening, layers therebetween, and a third layer is said to underlie the second layer, whether or not there are unnamed intervening layers therebetween.

The term "diode" is intended broadly to signify a structure that conducts current more readily in one direction than another. Thus, a diode is not required to and, in fact, typically does not completely block current in the reverse biased direction.

In the example of FIG. 1, the diode components of the first and second memory cells 30, 32 have preferred current directions pointing away from the conductors 20. In alternative embodiments, the preferred current directions 44 can both point toward the conductors 20, they can both point upwardly (in the view of FIG. 1), or they can both point downwardly (in the view of FIG. 1). In all of these cases, the diode components allow the memory cells 30, 32 to be addressed unambiguously, even though each of the conductors of the array (other than the conductors at the top and bottom of the array) are connected both to overlying conductors via overlying memory cells and to underlying conductors via underlying memory cells.

The foregoing detailed description has discussed only a few of the many forms that this invention can take. For this reason, this detailed description is intended only by way of illustration, and not by way of limitation. It is only the following claims, including all equivalents that are intended to define the scope of this invention.

What is claimed is:

1. A 3-dimensional read only memory array comprising:
   a substrate;
   a layer of first conductors overlying the substrate;
   a first, mask-programmed, insulating layer overlying the layer of first conductors;
   a layer of second conductors overlying the first insulating layer, said second conductors each positioned to cross over multiple ones of said first conductors;
   a second, mask-programmed, insulating layer overlying the layer of second conductors; and
   a layer of third conductors overlying the second insulating layer, said third conductors each positioned to cross over multiple ones of the second conductors;
   a plurality of first memory cells, each extending across the first insulating layer and positioned at an intersection of a respective first conductor and a respective second conductor; and
   a plurality of second memory cells, each extending across the second insulating layer and positioned at an intersection of a respective second conductor and a respective third conductor;
   each of said memory cells comprising a respective first diode component and a respective second diode component.

2. The 3-dimensional read only memory array of claim 1 wherein said diode components provide each memory cell with a preferred current conduction direction, and wherein said diode components are arranged such that for each set of crossing first, second and third conductors, the preferred current directions of the first and second memory cells aligned with the respective conductors are oppositely directed with respect to one another.

3. The 3-dimensional read only memory array of claim 1 wherein the first and second insulating layers comprise a material selected from the group consisting of: silicon dioxide, silicon nitride, ONO, amorphous silicon, tantalum pentoxide, PZT ferroelectric insulators, chalcogenide insulators, organic insulators, polyimide insulators, and combinations thereof.

4. The 3-dimensional read only memory array of claim 1 wherein the first and second diode components for at least first ones of the memory cells in a selected logic state form respective diodes selected from the group consisting of: P-N diodes, Schottky diodes, polysilicon diodes, micro-crystalline silicon diodes, micro-crystalline semiconductor diodes, germanium diodes, silicon-germanium diodes, gallium-arsenide diodes.

5. The 3-dimensional read only memory array of claim 1 wherein, for at least some of the memory cells, the respective first and second diode components are disposed on opposite sides of the respective insulating layer.

6. The 3-dimensional read only memory array of claim 1 wherein, for at least some of the memory cells, the respective first and second diode components are disposed on a first side of the respective insulating layer.

7. The 3-dimensional read only memory array of claim 1 wherein each insulating layer comprises an array of insulating portions and an array of conducting portions, wherein some of the memory cells extend across respective conducting portions, and wherein some of the memory cells extend across respective insulating portions.

8. The 3-dimensional read only memory array of claim 7 wherein the conducting portions comprise openings in the insulating layers.

9. The 3-dimensional read only memory array of claim 1 wherein the first conductors are parallel to and spaced apart from one another, wherein the second conductors are parallel to and spaced apart from one another, and wherein the third conductors are parallel to and spaced apart from one another.

10. The 3-dimensional read only memory array of claim 9 wherein the first and third conductors are parallel to one another and orthogonal to the second conductors.

* * * * *